United States Patent
Motwani (10) Patent No.: US 10,033,411 B2
(45) Date of Patent: Jul. 24, 2018

(54) ADJUSTABLE ERROR PROTECTION FOR STORED DATA

(71) Applicant: Intel Corporation, Santa Clara, CA (US)

(72) Inventor: Ravi Motwani, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/947,801

(22) Filed: Nov. 20, 2015

(65) Prior Publication Data

US 2017/0147429 A1    May 25, 2017

(51) Int. Cl.
| | |
|---|---|
| *G06F 3/06* | (2006.01) |
| *G06F 11/10* | (2006.01) |
| *H03M 13/25* | (2006.01) |
| *H03M 13/00* | (2006.01) |
| *H03M 13/35* | (2006.01) |

(52) U.S. Cl.
CPC ........ *H03M 13/6312* (2013.01); *G06F 3/064* (2013.01); *G06F 3/0619* (2013.01); *G06F 3/0661* (2013.01); *G06F 3/0679* (2013.01); *G06F 11/1012* (2013.01); *H03M 13/35* (2013.01)

(58) Field of Classification Search
CPC ........... G06F 2212/401; G06F 11/1012; G06F 12/0246; G06F 2212/403; G06F 11/1064; G06F 3/0619; G06F 3/064; G06F 3/0679; G06F 3/0661; H03M 13/6312; H03M 13/35
USPC ........................................................ 714/766
See application file for complete search history.

(56) References Cited

U.S. PATENT DOCUMENTS

| | | | |
|---|---|---|---|
| 5,912,839 | A | 6/1999 | Ovshinsky et al. |
| 7,340,666 | B1 * | 3/2008 | Wright ............... G06F 11/1008 714/774 |
| 7,590,918 | B2 | 9/2009 | Parkinson |
| 7,600,078 | B1 | 10/2009 | Cen et al. |

(Continued)

OTHER PUBLICATIONS

Qureshi, Moinuddin K., "Pay-As-You-Go: Low-Overhead Hard-Error Correction for Phase Change Memories", MICRO'11, Dec. 3-7, 2011, Porto Alegre, Brazil, 11 pages.

(Continued)

*Primary Examiner* — James C Kerveros
(74) *Attorney, Agent, or Firm* — Compass IP Law PC (57) ABSTRACT

An apparatus is described that includes a semiconductor chip having memory controller logic circuitry. The memory controller logic circuitry has compression circuitry to compress a cache line data structure to be written into a system memory. The memory controller logic circuitry has adjustable length ECC information generation circuitry to generate an amount of ECC information for the cache line data structure based on an amount of compression applied to the cache line data structure by the compression circuitry. The memory controller logic having circuitry to implement a write process sequence for the cache line data structure that is specific for the cache line data structure's amount of compression and/or amount of ECC information and to implement a different write process sequence that is specific for another cache line data structure having a different amount of compression and/or ECC information as the cache line data structure.

19 Claims, 10 Drawing Sheets

(56) References Cited

U.S. PATENT DOCUMENTS

| | | | |
|---|---|---|---|
| 7,756,053 | B2 | 7/2010 | Thomas et al. |
| 7,913,147 | B2 | 3/2011 | Swaminathan et al. |
| 8,051,253 | B2 | 11/2011 | Okin et al. |
| 8,462,537 | B2 | 6/2013 | Karpov et al. |
| 8,462,577 | B2 | 6/2013 | Leng et al. |
| 8,463,948 | B1 | 6/2013 | Qawami et al. |
| 8,612,676 | B2 | 6/2013 | Dahlen et al. |
| 8,549,380 | B2 | 10/2013 | Motwani |
| 8,549,382 | B2 | 10/2013 | Motwani |
| 8,605,531 | B2 | 12/2013 | Kau et al. |
| 8,607,089 | B2 | 12/2013 | Qawami et al. |
| 8,612,809 | B2 | 12/2013 | Casper et al. |
| 8,649,212 | B2 | 2/2014 | Kau et al. |
| 8,667,360 | B2 | 3/2014 | Motwani |
| 8,838,935 | B2 | 9/2014 | Hinton |
| 9,043,681 | B2 | 5/2015 | Kalavade et al. |
| 9,250,990 | B2 | 2/2016 | Motwani et al. |
| 9,294,224 | B2 | 3/2016 | Motwani |
| 9,298,552 | B2 | 3/2016 | Leem et al. |
| 9,298,606 | B2 | 3/2016 | Ramanujan |
| 9,317,429 | B2 | 4/2016 | Ramanujan et al. |
| 9,323,609 | B2 | 4/2016 | Motwani |
| 9,342,453 | B2 | 5/2016 | Nale et al. |
| 9,378,133 | B2 | 6/2016 | Nachimuthu et al. |
| 9,430,372 | B2 | 8/2016 | Nachimuthu et al. |
| 9,535,777 | B2 | 3/2017 | Kalavade et al. |
| 9,619,324 | B2 | 4/2017 | Kwok et al. |
| 2007/0005922 | A1 | 1/2007 | Swaninathan et al. |
| 2008/0016269 | A1 | 1/2008 | Chow et al. |
| 2008/0034148 | A1 | 2/2008 | Gower |
| 2008/0270811 | A1 | 10/2008 | Chow et al. |
| 2009/0313416 | A1 | 12/2009 | Nation |
| 2010/0110748 | A1 | 5/2010 | Best |
| 2010/0131827 | A1 | 5/2010 | Sokolov |
| 2010/0281340 | A1* | 11/2010 | Franceschini ....... G06F 12/0246 714/763 |
| 2010/0291867 | A1 | 11/2010 | Abdulla et al. |
| 2010/0293317 | A1 | 11/2010 | Confalonieri et al. |
| 2010/0306446 | A1 | 12/2010 | Villa et al. |
| 2010/0306453 | A1 | 12/2010 | Doller |
| 2010/0318718 | A1 | 12/2010 | Eilert et al. |
| 2011/0153916 | A1 | 6/2011 | Chinnaswamy et al. |
| 2011/0208900 | A1 | 8/2011 | Schuette et al. |
| 2011/0291884 | A1 | 12/2011 | Oh et al. |
| 2011/0320913 | A1* | 12/2011 | Stracovsky ......... G06F 11/1012 714/763 |
| 2013/0268728 | A1 | 10/2013 | Ramanujan et al. |
| 2013/0275661 | A1 | 10/2013 | Zimmer et al. |
| 2013/0290597 | A1 | 10/2013 | Faber |
| 2014/0089561 | A1 | 3/2014 | Pangal |
| 2014/0122973 | A1 | 5/2014 | Motwani |
| 2014/0129767 | A1 | 5/2014 | Ramanujan et al. |
| 2014/0297938 | A1 | 10/2014 | Puthiyedath et al. |
| 2015/0149857 | A1 | 5/2015 | Motwani et al. |
| 2015/0339239 | A1* | 11/2015 | Heddes ............... G06F 12/1081 710/308 |
| 2016/0085621 | A1 | 3/2016 | Motwani et al. |
| 2016/0156372 | A1 | 6/2016 | Motwani |
| 2016/0224241 | A1* | 8/2016 | Verrilli .................... G06F 3/061 |
| 2017/0093438 | A1 | 3/2017 | Motwani |
| 2017/0093439 | A1 | 3/2017 | Motwani |

OTHER PUBLICATIONS

Lee et al, "Architecting Phase Change Memory as a Scalable DRAM Alternative", ISCA '09, Jun. 20, 2009, 12 pgs., Austin, Texas, USA.

Condit et al., "Better I/O Through Byte-Addressable, Persistent Memory", SOSP '09, Oct. 11, 2009, pp. 133-146. Big Sky, Montana, USA.

Freitas et al., "Storage-class memory: The next storage system technology", IBM J. Res. & Dev., Jul./Sep. 2008, pp. 439-447, vol. 52, No. 4/5.

Akel et al., "Onyx: A Prototype Phase Change Memory Storage Array",www.flashmemorysummit.com/.../Proceeding_2011/08/11_5301_Akel.pdf, 5 pgs.

Mearian, "IBM announces computer memory breakthrough Phase-change memory offers 100 times the write performance of NAND flash", Jun. 30, 2011, 3 pgs.

Caulfield et al., "Moneta: A High-performance Storage Array Architecture for Next-generation, Non-volatile Memories", Micro 43: Proceedings of the 43rd Annual IEEE/ACM International Symposium on Microarchitecture, Atlanta, GA Dec. 2010 pp. 385-395.

"The Non-Volatile Systems Laboratory Coding for non-volatile memories", http://nvsl.ucsd.edu/ecc, printed Sep. 1, 2011. 2 pgs.

"The Non-Volatile Systems Laboratory Moneta and Onyx: Very Fast SS", http://nvsl.ucsd.edu/moneta/, 3 pgs., Sep. 1, 2011.

"The Non-Volatile Systems Laboratory NV-Heaps: Fast and Safe Persistent Objects", http://nvsl.ucsd.edu/nvuheaps/, 2 pgs., Sep. 1, 2011.

"Phase change memory-based 'moneta' system points to the future of computer storage", ScienceBlog, Jun. 2, 2011, 7 pgs.

Quereshi et al., "Scalable High Performance Main Memory System Using Phase-Change Memory Technology", ISCA '09, Jun. 20, 2009, 10 pgs., Austin, Texas, USA.

Kant, Dr. Krishna, "Exploiting NVRAM for Building Multi-Level Memory Systems", International Norkshop on Operating System Technologies for Large Scale NVRAM, Oct. 21, 2008, Jeju, Korea, 19 pages.

Bailey et al., "Operating System Implications of Fast, Cheap, Non-Volatile Memory" 13th USENIX, HOTOS11 2011, May 9-11, 2011, 5 pgs.

Raoux et al., "Phase-change random access memory: A scalable technology", IBM J. Res. & Dev., Jul./Sep. 2008, pp. 465-479, vol. 52, No. 4/5.

Chen et al., "Rethinking Database Algorithms for Phase Change Memory", 5th Biennial Conference on Innovative Data Systems Research (CIDR '11), Jan. 9, 2011, 11 pgs., Asilomar, California, USA.

Jacob et al., "The Memory System You Can't Avoid It, You Can't Ignore It, You Can't Fake It", 2009, 77 pgs., Morgan & Claypool.

Mogul et al., "Operating System Support for NVM+DRAM Hybrid Main Memory", 12th Workshop on Hot Topics in Operating Systems (HatOS XII), May 18, 2009, 9 pgs.

Atu, et al., "eNVy: A Non-Volatile, Main Memory Storage System" 1994 ACM., ASPLOS VI. pp. 86-97.

Dhiman, et al. "PDRAM: A Hybrid PRAM and DRAM Main Memory System", Jul. 26, 2009, Department of Computer Science and Engineering, 6 pages.

* cited by examiner

ADJUSTABLE ERROR PROTECTION FOR STORED DATA

FIELD OF INVENTION

The field of invention pertains to the computing sciences, and, more specifically, to adjustable error protection for stored data.

BACKGROUND

Computing systems typically include system memory (or main memory) that contains data and program code of the software code that the system's processor(s) currently execute. A pertinent bottleneck in many computer systems is the system memory. Here, as is understood in the art, a computing system operates by executing program code stored in system memory. When executed, the program code reads and writes data from/to system memory. As such, system memory is heavily utilized with many program code and data reads as well as many data writes over the course of the computing system's operation. Finding ways to speed-up system memory is therefore a motivation of computing system engineers.

FIGURES

A better understanding of the present invention can be obtained from the following detailed description in conjunction with the following drawings, in which.

DETAILED DESCRIPTION

Figure 1:
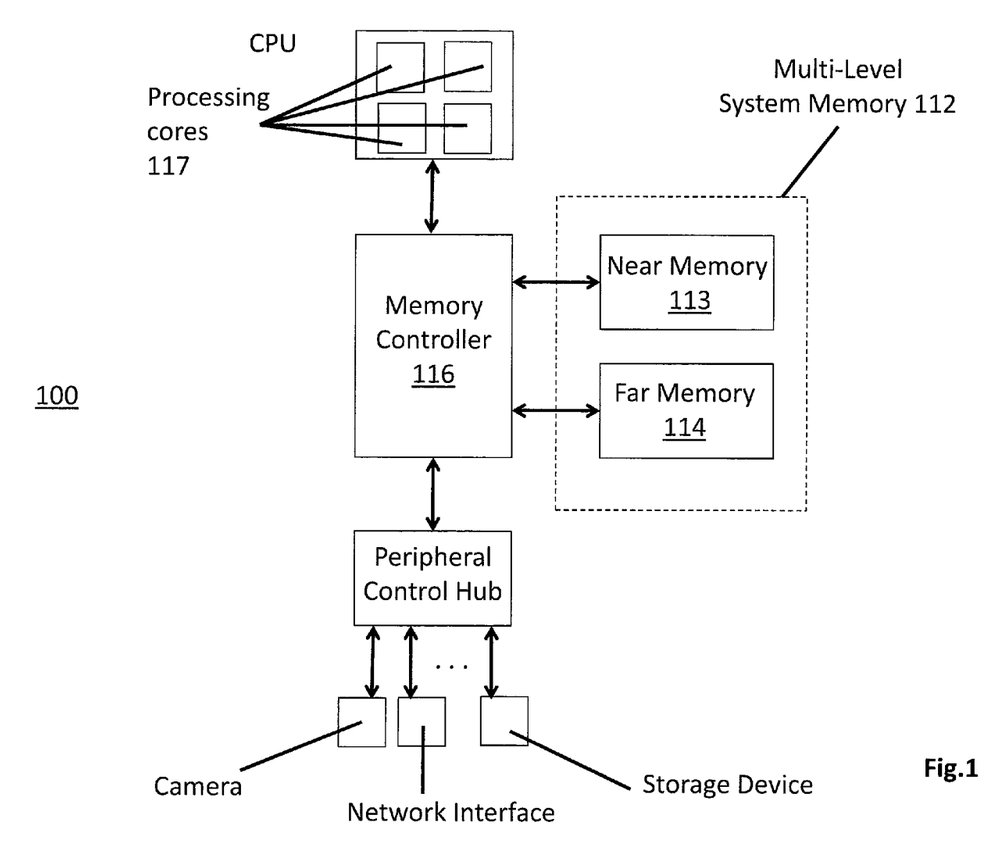
FIG. 1 shows a computing system having a multi-level system memory.

One of the ways to speed-up system memory without significantly increasing power consumption is to have a multi-level system memory. FIG. 1 shows an embodiment of a computing system 100 having a multi-tiered or multi-level system memory 112. According to various embodiments, a faster near memory 113 may be utilized as a memory side cache.

In the case where near memory 113 is used as a memory side cache, near memory 113 is used to store data items that are expected to be more frequently called upon by the computing system. The near memory cache 113 has lower access times than the lower tiered far memory 114 region. By storing the more frequently called upon items in near memory 113, the system memory will be observed as faster because the system will often read items that are being stored in faster near memory 113.

According to some embodiments, for example, the near memory 113 exhibits reduced access times by having a faster clock speed than the far memory 114. Here, the near memory 113 may be a faster, volatile system memory technology (e.g., high performance dynamic random access memory (DRAM)) or faster non volatile memory. By contrast, far memory 114 may be either a volatile memory technology implemented with a slower clock speed (e.g., a DRAM component that receives a slower clock) or, e.g., a non volatile memory technology that is inherently slower than volatile/DRAM memory or whatever technology is used for near memory.

For example, far memory 114 may be comprised of an emerging non volatile byte addressable random access memory technology such as, to name a few possibilities, a three dimensional crosspoint memory device, a phase change based memory, a ferro-electric based memory (e.g., FRAM), a magnetic based memory (e.g., MRAM), a spin transfer torque based memory (e.g., STT-RAM), a resistor based memory (e.g., ReRAM), a Memristor based memory, universal memory, Ge2Sb2Te5 memory, programmable metallization cell memory, amorphous cell memory, Ovshinsky memory, etc.

Such emerging non volatile random access memories technologies can have some combination of the following: 1) higher storage densities than DRAM (e.g., by being constructed in three-dimensional (3D) circuit structures (e.g., a three dimensional crosspoint circuit structure); 2) lower power consumption densities than DRAM (e.g., because they do not need refreshing); and/or, 3) access latency that is slower than DRAM yet still faster than traditional non-volatile memory technologies such as FLASH. The latter characteristic in particular permits an emerging non volatile memory technology to be used in a main system memory role rather than a traditional storage role (which is the traditional architectural location of non volatile storage).

Regardless of whether far memory 114 is composed of a volatile or non volatile memory technology, in various embodiments far memory 114 acts as a system memory in that it supports finer grained data accesses (e.g., cache lines) rather than larger blocked based accesses associated with traditional, non volatile storage (e.g., solid state drive (SSD), hard disk drive (HDD)), and/or, otherwise acts as an (e.g., byte) addressable memory that the program code being executed by processor(s) of the CPU operate out of.

Because near memory 113 acts as a cache, near memory 113 may not have its own individual addressing space. Rather, only far memory 114 includes the individually addressable memory space of the computing system's main memory. In various embodiments near memory 113 acts as a cache for far memory 114 rather than acting a last level CPU cache (generally, a CPU level cache is able to keep cache lines across the entirety of system memory addressing space that is made available to the processing cores 117 that are integrated on a same semiconductor chip as the memory controller 116).

For example, in various embodiments, system memory is implemented with dual in-line memory module (DIMM) cards where a single DIMM card has both DRAM and (e.g., emerging) non volatile memory chips disposed in it. The DRAM chips effectively act as an on board cache for the non volatile memory chips on the DIMM card. The more frequently accessed cache lines of any particular DIMM card can be found on that DIMM card's DRAM chips rather than its non volatile memory chips. Given that multiple DIMM cards are typically plugged into a working computing system and each DIMM card is only given a section of the system memory addresses made available to the processing cores 117 of the semiconductor chip that the DIMM cards are coupled to, the DRAM chips are acting as a cache for the non volatile memory that they share a DIMM card with rather than a last level CPU cache.

In other configurations, DIMM cards having only DRAM chips may be plugged into a same system memory channel (e.g., a DDR channel) with DIMM cards having only non volatile system memory chips. In some cases, the more frequently used cache lines of the channel will be found in the DRAM DIMM cards rather than the non volatile memory DIMM cards. Thus, again, because there are typically multiple memory channels coupled to a same semiconductor chip having multiple processing cores, the DRAM chips are acting as a cache for the non volatile memory chips that they share a same channel with rather than as a last level CPU cache.

Although the above example referred to packaging solutions that included DIMM cards, it is pertinent to note that this is just one example and other embodiments may use other packaging solutions (e.g., stacked chip technology, one or more DRAM and phase change memories integrated on a same semiconductor die or at least within a same package as the processing core(s), etc.).

In the case where near memory acts as "memory side" cache as described just above in the preceding examples, entries into the cache can be determined, at least in part, by what is being read from system memory rather than, as is the case with a CPU cache (such as a last level CPU cache), solely by what is being evicted from a higher level CPU cache. In yet other embodiments, near memory 113 may act as a CPU level cache.

The architecture of the near memory cache 113 may also vary from embodiment. According to one approach, the near memory cache 113 is implemented as a direct mapped cache in which multiple system memory addresses map to one cache line slot in near memory 113. Other embodiments may implement other types of cache structures (e.g., set associative, etc.). Regardless of the specific cache architecture, different cache lines may compete for the same cache resources in near memory 113.

For example, in the case of a direct mapped cache, when requests for two or more cache lines whose respective addresses map to the same near memory 113 cache line slot are concurrently received by the memory controller 116, the memory controller 116 will keep one of the cache lines in near memory cache 113 and cause the other cache line to be kept in far memory 114.

Whenever a request for a cache line is received by the memory controller 116, the memory controller first checks for the cache line in near memory cache 113. If the result is a cache hit, the memory controller 116 services the request from the version of the cache line in near memory 113. For example, in the case of a read request, the version of the cache line in near memory cache is forwarded to the requestor whereas in the case of a write, the version of the cache line in near memory cache is written over and kept in the near memory cache. In the case of a cache miss, for both read and write requests, the cache line that is targeted by the request is copied from far memory 114 and stored in near memory cache 113. In order to make room for the new cache line in near memory cache 113, another cache line that competes with the targeted cache line is evicted from near memory cache 113 and sent to far memory 114.

Certain embodiments may also make use of a sectored cache. In the case of a sectored cache, near memory caches super-lines composed of multiple cache lines. As is known in the art, a cache line typically includes multiple individually addressable (e.g., 32 bit or 64 bit) data or instruction items. For example, a typical cache line may be 64 bytes and contain eight 64 bit data units. The size of a cache line (the number of data/instruction items it contains) is typically coextensive with the width of the internal caches of the corresponding CPU core(s). By contrast, a super-line may consist, for example, of 4 cache lines (=4×64 bytes=256 bytes of information). In the case of a sectored cache that caches super-lines, a single read cache hit results in multiple, e.g., four, cache lines being forwarded to the CPU from near memory.

Multiple cache lines are also written into far memory when a super line is written into far memory. For example in an implementation where a super line consists of 256 byte blocks (e.g., of four 64 byte cache lines), when a super line is evicted from near memory and written into far memory, a 256 byte block is written into far memory.

A possible issue is that far memory, as discussed at length above, may be implemented with an emerging memory technology such as an emerging non volatile memory technology. Such technologies, being emerging, may have higher error rates than more mature memory technologies such as DRAM or SRAM.

A motivation therefore exists to extend or expand error correction code protection for the data that is kept in far memory. For certain environments, such as, at least, enterprise environments, large percentages of super lines have redundant data that may be compressed into a smaller footprint super line. The extra data width that results from having a compressed super line can then be used for additional error correction code (ECC) information for the super line. As such, the super line can enjoy enhanced ECC protection.

For example, in one simulation having 256 byte super lines in an enterprise data environment, 96% of the super lines could be compressed to 240 bytes or less. As such, 96% of the super lines could conceivably enjoy at least 16 extra bytes of ECC information (i.e., 256 bytes−240 bytes=16 bytes of "freed up" data width that can be used for extra ECC information). Super lines in enterprise environments may be more compressible because enterprise processes are often secured and the security operations may tend to impose redundant data patterns into the data structures.

Figure 2A:
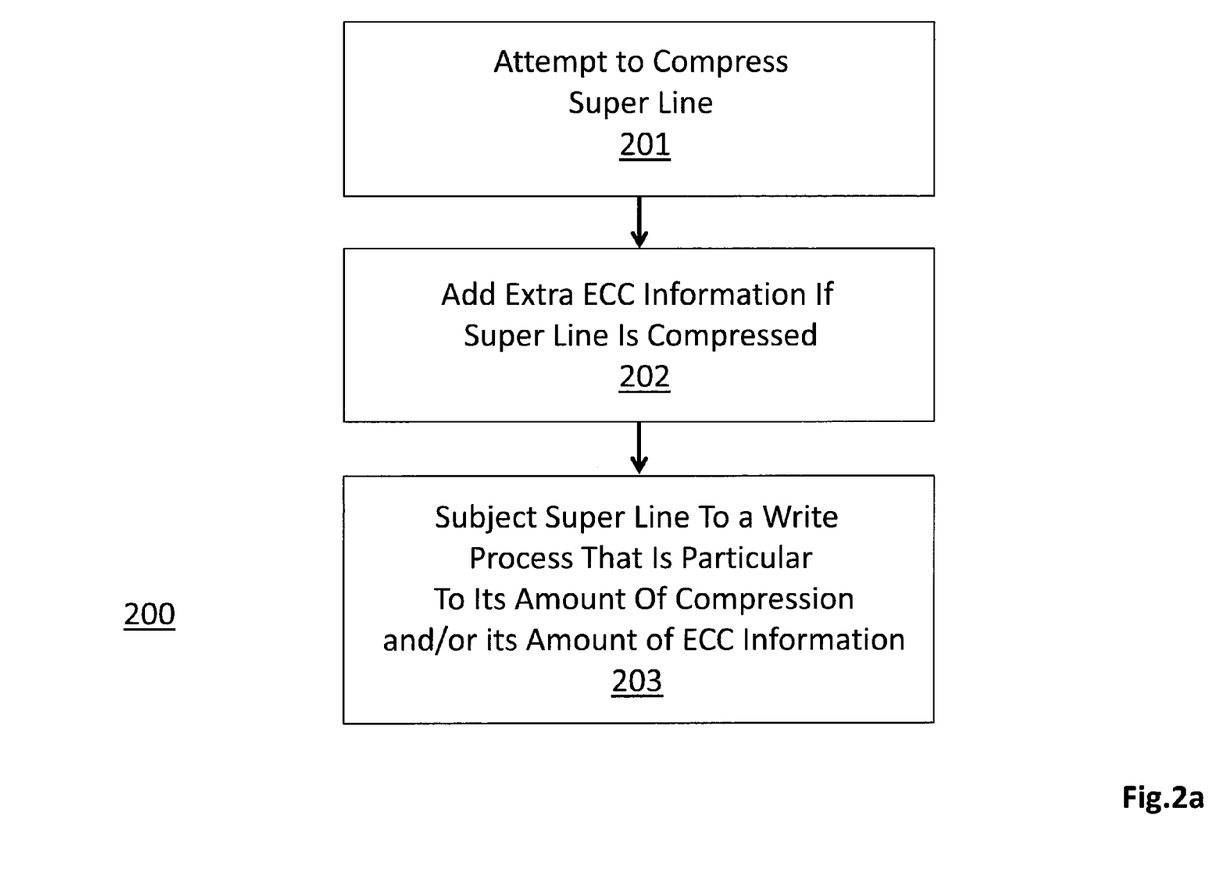
FIGS. 2a and 2b pertain to an approach for providing enhanced ECC coverage to data stored in the multi-level system memory of FIG. 1.

FIG. 2a shows a far memory write methodology that attempts to compress 201 a super line to be written into far memory, and, the size of the ECC information that is generated 202 for the super line is based on the extent to which the super cache line is compressed. In other words, super lines that can be compressed more have larger ECC fields (the data width freed up by the compression is used to expand the ECC field) and super lines that are compressed less or not compressed at all have smaller ECC fields (less or no data width is freed up by the compression so the ECC field can not be as large as with a more compressed super line). The super line is then written 203 into far memory according to a process that is specific to the amount of compression and/or size of its ECC information. As such, super lines with can be written into far memory according to different write processes based on their ECC coverage. For instance, a super line having better ECC coverage (more ECC bits) may be written into a region of far memory more prone to storage errors while another super line having weaker ECC is written to another region of far memory that is less prone to errors.

Figure 2B:
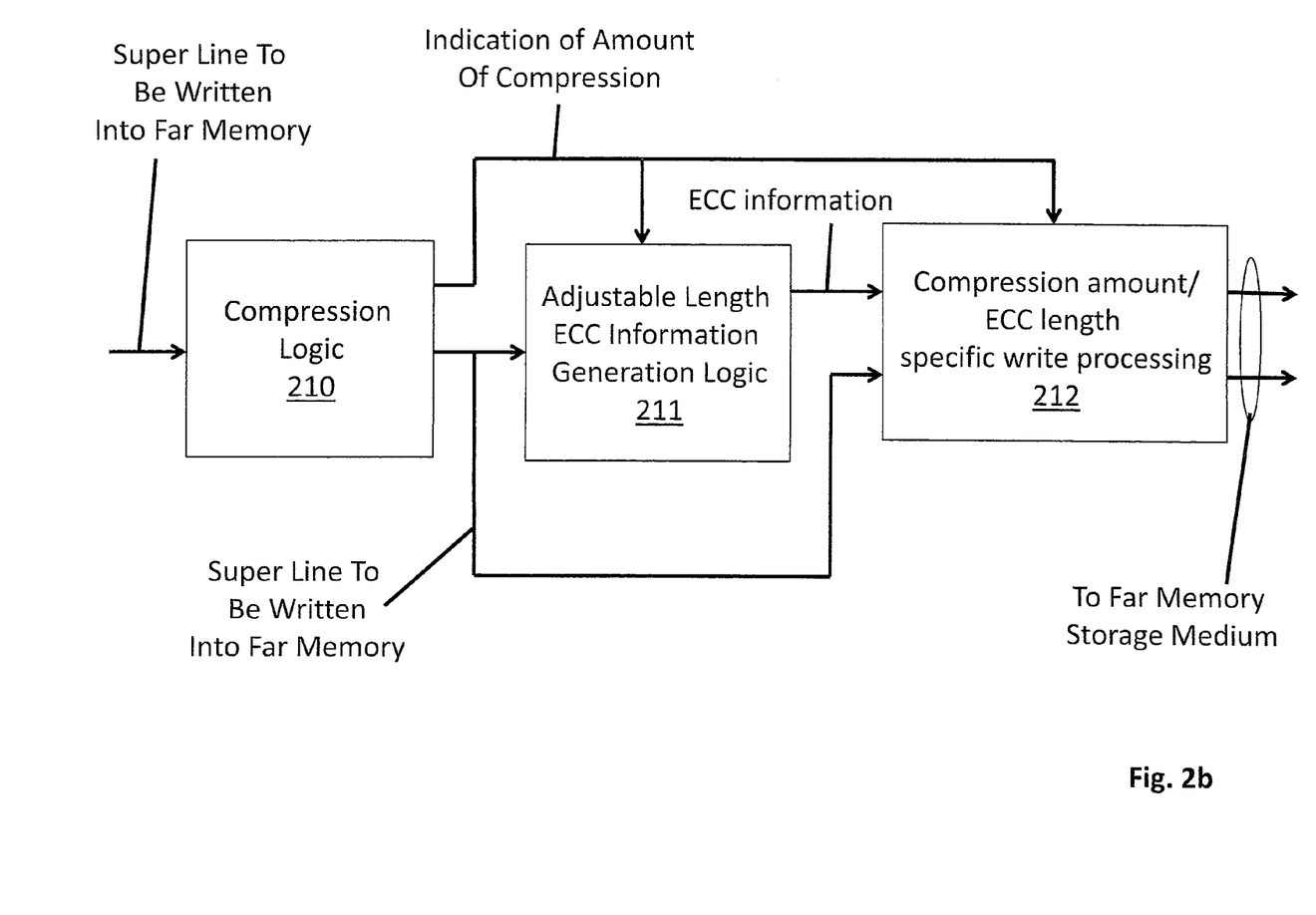

FIG. 2b shows a high-level hardware design for super line write processing circuitry that implements the methodology discussed above. As observed in FIG. 2b the basic write path includes a compression stage 210 that attempts to compress a super line to be written into far memory. In an embodiment, a frequent pattern compression (FPC) technique is used. As is known in the art, an FPC scheme compresses a data structure (such as a super line in this case) on a word by word basis by keeping common word patterns in a compressed format accompanied with an appropriate prefix. Other possible compression techniques that may be used include WKDM, LZ based compression schemes, etc.)

The super line is then presented to adjustable length ECC information generation logic 211 which generates more or less ECC information for the super line depending on how much it was compressed. Again, super lines that are more compressed will have larger ECC fields and super lines that are less compressed will have smaller ECC fields. Downstream write processing circuitry 212 will then treat process the super line based on its amount of compression and/or its amount of ECC information. As such, super lines with different amounts of compression and corresponding ECC coverage are handled differently in being written into far memory.

Figure 3A:
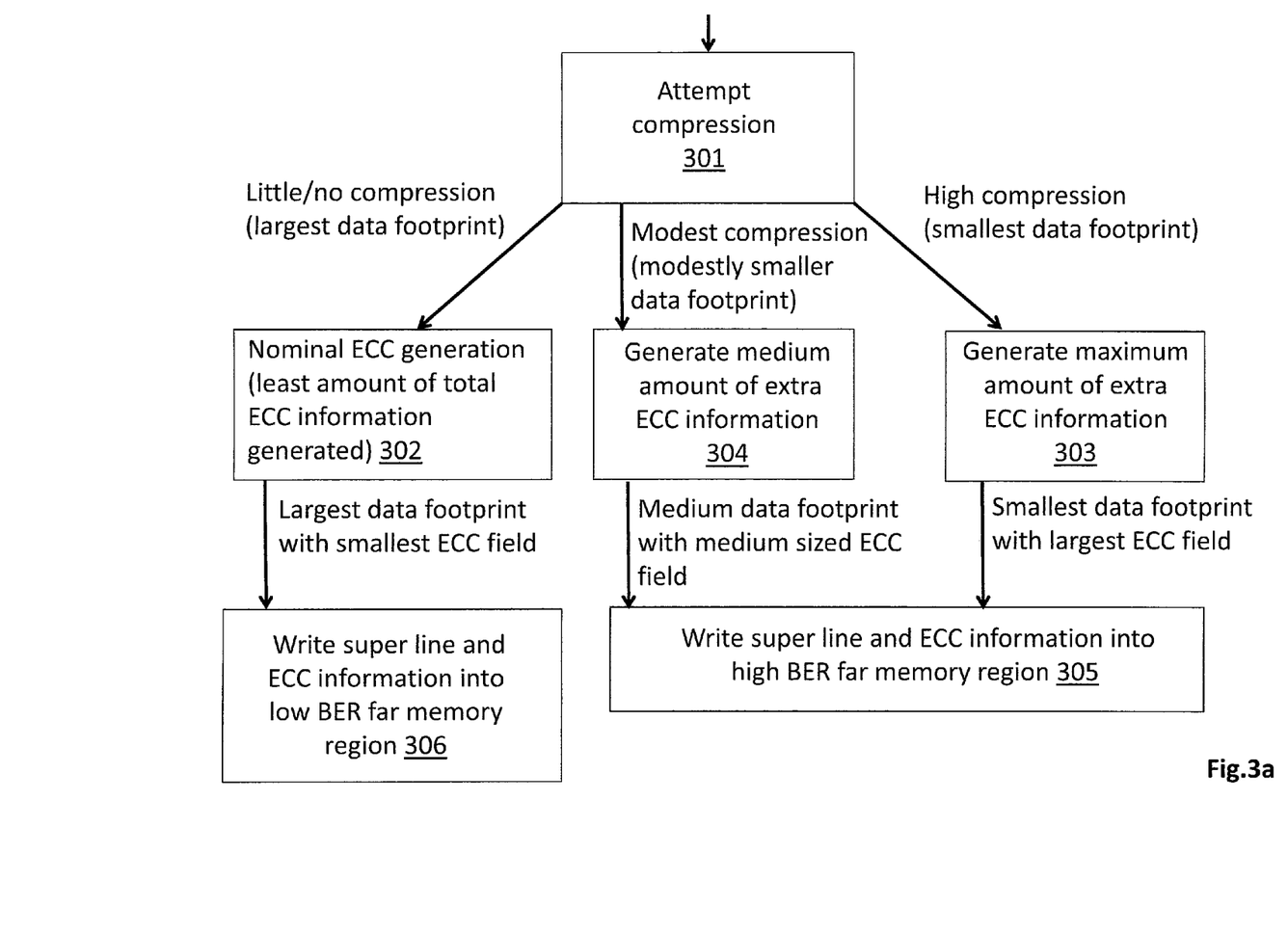
FIGS. 3a and 3b pertain to a first embodiment of the approach of FIGS. 2a and 2b.

FIGS. 3a,b; 4a,b and 5a,b pertain to first, second and third embodiments respectively of the approach discussed just above in FIGS. 2a and 2b. Each are discussed in succession below.

Figure 3B:
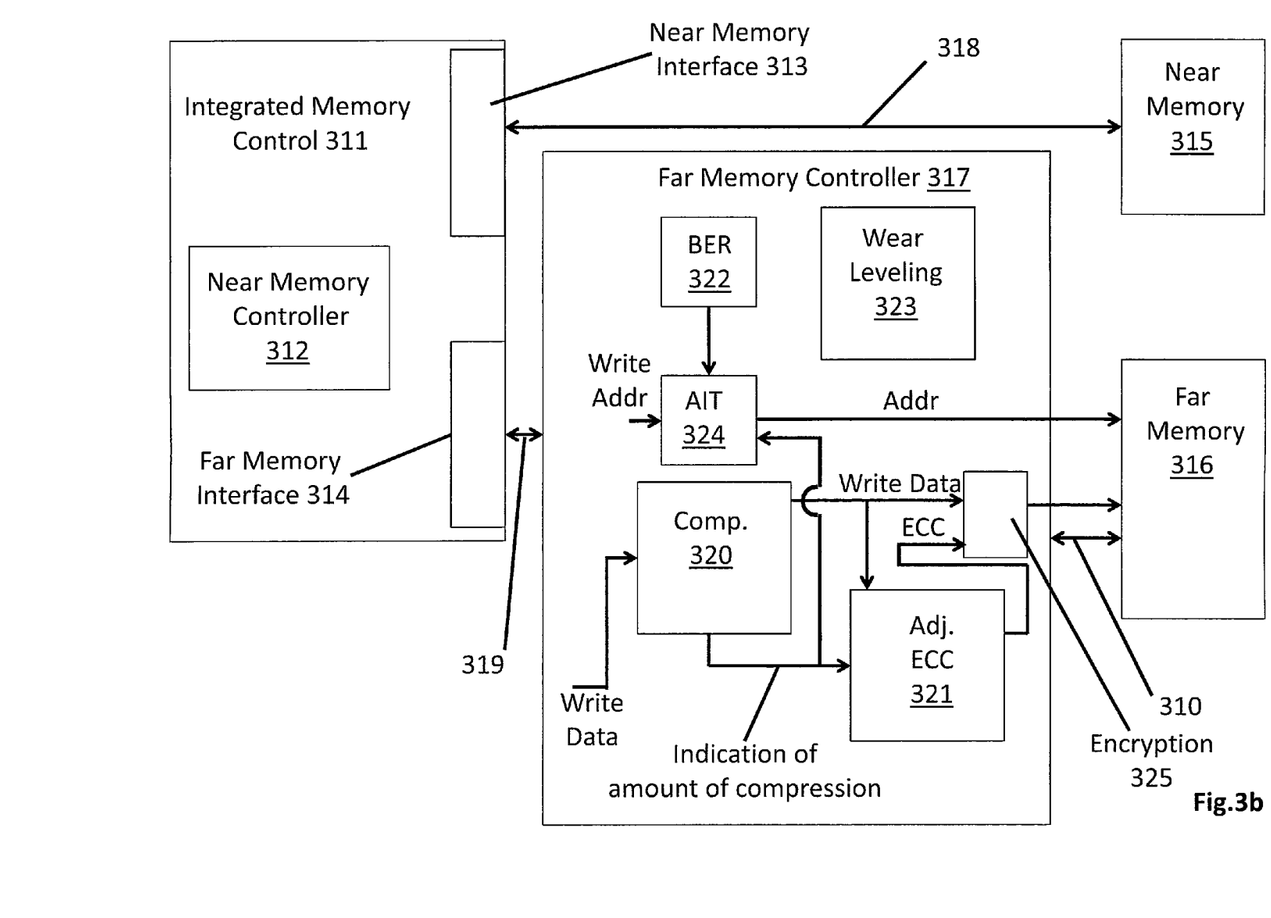

FIG. 3a shows a methodology and FIG. 3b shows an exemplary hardware design for a first embodiment of the approach discussed just above. As observed in FIG. 3a, an attempt is made to compress a super line to be written into far memory 301. One of multiple different processing sequences is then followed based on the amount of compression that was able to be applied to the line. In one scenario, no real compression occurs (e.g., because the super line does not have any redundant data patterns) and the super line is encoded by a nominal ECC coding technique 302 that produces a nominally sized or minimum ECC field (e.g., X bytes). In various implementations, potentially, less than 4% of all super lines subscribe to this characterization.

In another scenario, a large amount of compression is achieved and the super line is encoded by an aggressive ECC coding technique 303 that builds a largest ECC information field (e.g., X+16 bytes) for the super line. In yet another scenario, a modest amount of compression is achieved and the super line is encoded by an ECC coding process 304 that is more aggressive than the nominal ECC coding process 302 but less aggressive than the aggressive ECC coding process 303 and that, correspondingly, builds a medium ECC information field that is larger than the nominal ECC field size but smaller than the aggressive ECC field size (e.g., X+8 bytes). As such, the size of the ECC field expands commensurate with the data width savings from the amount of compression.

In the embodiment of FIG. 3a, a super line having any extra ECC information (middle and rightmost paths in FIG. 3a) is written into a section of the non volatile memory that exhibit a higher bit error rate 305, while, a super line that only has nominal ECC information (leftmost path in FIG. 3a) is written into a section of the far memory having a lower bit error rate 306. Here, in the case of emerging far memory technologies, wear out or other error inducing mechanisms may exist within the storage medium. As such, significant regions of the far memory may exhibit a higher bit error rate as compared to traditional memory technologies. However, in the approach of FIG. 3a, perhaps as many as 96% of the super lines will be able to be compressed which, in turn, permits them to have extended or extra ECC coverage that essentially protects the data stored in a section of the memory that exhibits a higher bit error rate.

By contrast, non-compressed super lines that do not receive extended ECC coverage are stored in a region of the emerging memory that does not exhibit a higher bit error rate. With perhaps as little as only 4% of the super lines having only nominal ECC coverage, only a small storage region of the far memory need be characterized as having a low bit error rate. Thus the overall solution protects the integrity of the information being kept in far memory even if the far memory is implemented with an emerging technology having significant regions of storage regions that exhibit a higher bit rate that traditional memory technologies.

FIG. 3b shows an exemplary system memory design for a system that implements the methodology of FIG. 3a. An integrated memory controller 311 includes a near memory controller 312, a near memory interface 313 and a far memory interface 314. The near memory controller 312, e.g., determines hits/misses in near memory cache if near memory 315 is implemented as a cache. If near memory 315 is implemented as, e.g., a higher priority region of system memory having its own dedicated address space, the near memory controller 312 may be obviated (in this case the integrated memory controller 311 simply directs requests that fall within a certain range of addresses to the near memory 315 and directs requests that fall within another range of addresses to the far memory 316).

The far memory interface 314 communicates with a far memory controller 317 that performs various tasks associated with the management of the far memory 316. Again, far memory 316 may be implemented with an emerging technology that could benefit from the special operations provided by the far memory controller 317. Some of these are described further below.

Various implementations of the system of FIG. 3b may exist. Here, any of links 318, 319 and/or 310 may be logical and/or physical links depending on implementation. For example, in one embodiment, the far memory controller 317 is located on a far memory DIMM card with far memory chips that the far memory controller 317 is responsible for managing. In this implementation, e.g., link 319 is a memory channel that emanates from the integrated memory controller 311 which is a host side memory controller. In the same embodiment, near memory DIMM cards (having, e.g., DRAM memory chips) may or may not plug into the same memory channel that the aforementioned far memory DIMM card plugs into.

In the case of the later (a near memory DIMM does not plug into the same memory channel as a far memory DIMM), link 318 is a different physical link than either of links 319 and 310.

In the case of the former (near memory DIMM plugs into the same memory channel as the far memory DIMM), links 318 and 319 correspond to a same physical memory channel but potentially different logical channels. For example, the near memory DIMM may be communicated with using a standard DDR signaling protocol while the far memory controller is communicated with using the same DDR physical channel (and therefore uses many of the same signals as the near memory communication) but that additionally executes a transactional protocol over the DDR channel.

In yet alternate or combined embodiments the near memory DRAM memory chips may be located on the same DIMM card as the far memory controller and the far memory memory chips. In this case, again links 318, 319 may correspond to a same physical channel but different logical channels where the same physical channel is directed to a same DIMM card rather than different DIMM cards.

In yet other embodiments the far memory controller 317 may be integrated on the host side, e.g., as part of the integrated memory controller 311. In these embodiments, links 318 and 310 may be the same or different physical and/or logic channels depending on implementation. In an embodiment where far memory DIMM cards are plugged into different physical memory channels than near memory DIMM cards, links 318 and 310 correspond to different physical memory channels. By contrast, if near memory DIMM cards can be plugged into the same memory channel as far memory DIMM cards, links 318 and 310 may correspond to the same physical memory channel but where different logical protocols are correspondingly executed over the channel to communicate to the two different memory levels. The same is true in implementations where near memory memory devices and far memory memory devices are disposed on a same DIMM card.

In yet other embodiments, different packaging arrangements than those described just above may be implemented but the same over-arching principles still apply. For example, in one embodiment the near memory devices may be packaged in a same processor package that includes the processor(s) and integrated memory controller 311 (e.g., by stacking the near memory memory chips over a system-on-chip die that includes the processor(s) and integrated memory controller 311) while the far memory devices may be packaged externally from the processor package. In this case, if the far memory controller 307 is also located outside the processor package, link 318 is an internal link within the processor package and link 319 is an external link that emanates from the processor package. By contrast, if the far memory controller 317 is integrated within the processor package, link 319 is an internal link within the processor package and link 310 is an external link from the processor package.

Returning to a discussion of the features of the far memory controller 317, as observed in the embodiment of FIG. 3b, the far memory controller 317 includes an address indirection table (AIT) 324 that correlates system memory addresses to actual physical memory addresses within far memory 316. Because entries in the AIT table 324 can be changed, the system memory address to physical address translations can be dynamically changed so as to reallocate which physical far memory storage locations store data for which system memory addresses.

The address indirection function may be used, for instance, with a wear leveling tracker 323 that determines which physical far memory addresses are being called upon more frequently than other physical far memory addresses. If certain addresses receive, e.g., a higher threshold of read/write activity, the corresponding storage cells may exhibit wear out of their ability to store data reliably before other storage cells that receive fewer read/write requests. The wear leveling tracker 323 tracks the operation of the far memory 316 and will physically move or copy frequently targeted data to fresher physical locations that have received fewer read/write requests and update the address indirection table 318 accordingly.

As observed in FIG. 3b, the far memory controller 317 also includes a write data path having logic to implement the methodology of FIG. 3a. As discussed with respect to FIG. 2b, the write data path includes compression logic 320 to compress super lines as they are received for a write operation into far memory 316 and an adjustable ECC information length generation unit 321 to generate the appropriate ECC information for the cache line being written based on its amount of compression. Additionally, the far memory controller 317 may include an encryption/data scrambling unit to encrypt/scramble the super line data before it is physically written into far memory and logic to perform any associated data padding.

Bit error rate (BER) tracking logic 322 detects which far memory storage cells and/or storage regions exhibit higher bit error rates than other far memory cells/regions. The bit error rate tracking logic 322 may (but need not) be part of the wear leveling logic 323. The bit error rate tracking logic 322 is coupled to the address indirection table 318 which also receives from the write path logic the identity of those system memory addresses that are receiving extended ECC coverage and those which are not. With this information and with the bit error rate tracking information, the control logic circuitry for the address indirection table 318 can assign super lines having extended ECC coverage to physical locations of far memory 316 having higher bit error rates and assign those super lines having nominal ECC coverage to physical locations of far memory 316 having lower bit error rates.

The granularity at which bit error rate based physical location assignments are made can vary from embodiment. For example, as the exemplary methodology of FIG. 3a shows, there are three separate processing paths based on three different levels of compression. As such, three different bit error rate regions may be identified, one for each path. For example, a lowest bit error rate region for the leftmost path of FIG. 3a, a higher bit error rate region for the middle path of FIG. 3a, and, a highest bit error rate region for the rightmost path of FIG. 3a. Alternatively, only a single higher bit error rate region may be identified and super lines from the middle and rightmost paths of FIG. 3a may be stored in this region. Likewise, the existence of three separate paths in FIG. 3a is only exemplary. Some embodiments may have fewer paths, other embodiments may have more paths with corresponding adjustments in ECC information size amongst the paths.

As described above with respect to FIG. 2b, the adjustable ECC information length generation logic 321 is able to generate more or less ECC information based on the size of the super line after the compression logic stage 320. In an embodiment, as described above, the ECC generation unit 321 will generate: 1) nominal ECC protection information for super lines having little or no compression; 2) more ECC protection information for super lines having modest compression; and, 3) even more ECC protection information for super lines having the most compression. ECC generation circuitry is well known in the art. Generally, the hardware for the most aggressive compression can also be used for the lesser compressed super lines to generate less ECC information.

Other embodiments may choose to not track and write to regions of the far memory based on bit error rate but nevertheless still seek improved ECC coverage through different ECC coverage dependent write processing paths.

Figure 4A:
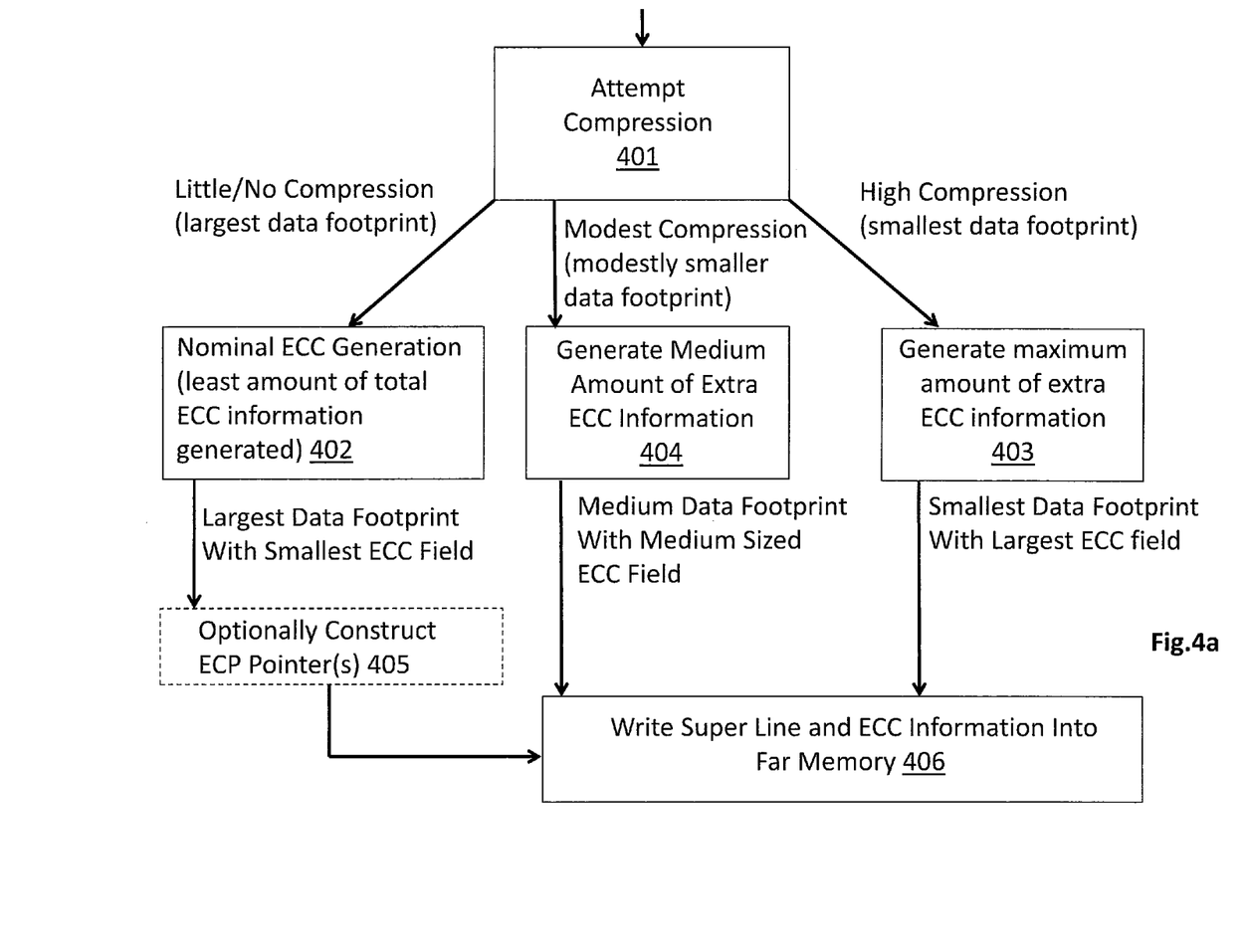
FIGS. 4a and 4b pertain to a second embodiment of the approach of FIGS. 2a and 2b.
Figure 4B:
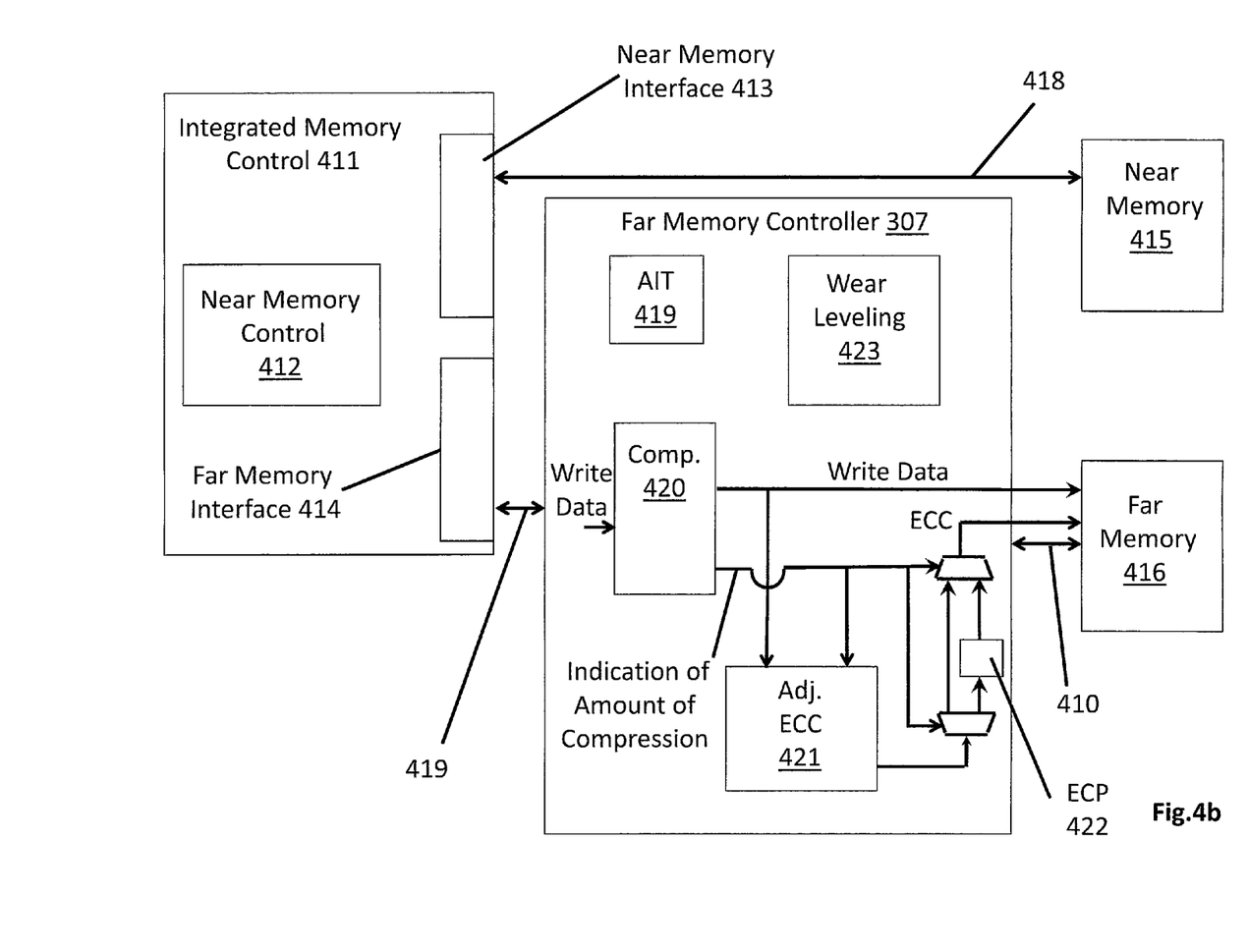

FIGS. 4a and 4b pertain to another write methodology and corresponding hardware implementation embodiment in which the non compressed path is provided with error correction pointers (ECP pointers) 405 to effectively provide for enhanced error protection for non compressed super lines. ECP pointers are data structures that are associated with a specific physical storage location in far memory and record correct data for any unreliable bit in the physical location. For example, in the case of a 256 B super line, there are 2048 bits per super line. Each one of the 2048 different bit locations can be uniquely identified with an 11 bit data field. Adding one bit for the correct data value yields a 12 bit data structure that can identify any bit location in the super line and its correct data value.

Thus, for instance, if the far memory controller recognizes that the $3^{rd}$ bit of a particular region that stores a super line is stuck to a same value, 11 bits of the ECP structure will identify the $3^{rd}$ bit. Anytime the super line is written to thereafter, the $3^{rd}$ bit of the super line is written to the 12th bit of the ECP structure. The ECP structure is then stored in another region of far memory or in register space of the far memory controller.

When the super line is read back from far memory (e.g., in response to a read request), the super line is read from its nominal region within the far memory, and, the ECP structure is also read. The information in the ECP structure is then merged with the super line to produce a correct overall data structure (the $12^{th}$ bit in the ECP structure is put into the $3^{rd}$ bit location of the super line). More than one ECP structure can be associated with a single super line. For example if a different bit of the same super line becomes unreliable, e.g., the $17^{th}$ bit, another 12 bit ECP structure can be created for the super line. The super line will therefore have two 12 bit ECP structures associated with it. One bit to record the correct data of the $3^{rd}$ bit and another bit to record the correct data of the $17^{th}$ bit.

As observed in FIG. 4a, an ECP structure is optionally created 405 depending on whether the super line that has little/no compression is being written to a storage location that is known to have a bad bit. If so, an ECP structure is created and stored for each known bad bit of the storage location that the super line is being written to. If the super line is being written to a location that is not known to have any bad bits, no ECP structure is created for the super line.

Here again, in an embodiment, unlike the approach of FIG. 3a, in the approach of FIG. 4a, there is no attempt to store various super lines in various far memory regions based on the bit error rates of the far memory regions. Rather, super lines with varying ECC coverage are written into far memory 406 without regard for any calculated bit error rate.

Because the middle and right most paths of FIG. 4a, however, have extended ECC coverage, super lines written according to these paths are not given an ECP option because their extended ECC coverage is presumed to be able to recover the data of any bad bits within the storage medium that they are being written to should any exist. By contrast, because the leftmost path has the weakest ECC coverage, super lines written according to the leftmost path may not have sufficient ECC coverage to recover data written to a bad bit. As such, super lines written along the leftmost path are given ECP pointer assistance 405.

Other embodiments may choose different degrees of ECP coverage. For example, the leftmost path may be provided with ability to create more ECP structures than the middle path and the middle path is still provided with some ECP coverage if the need arises. In still other embodiments, ECP coverage may even be extended to the rightmost path.

FIG. 4b shows a hardware implementation embodiment that can be used to implement the write process strategy of FIG. 4a. The hardware implementation of FIG. 4b includes much of the same components as the hardware implementation embodiment of FIG. 3b. However, the bit error rate component is not present. Instead, ECP logic 422 identifies bad bits in super lines read from far memory 416 (e.g., by analyzing read request responses) and records their physical addresses in an ECP table (not shown). The ECP table can be stored in register space or memory within the far memory controller, or, far memory. If the address of a super line being written to has little/no compression and whose address matches an entry in the ECP table, an ECP structure is created for the super line. Otherwise no ECP structure is created. In alternate embodiments, as alluded to above, ECP coverage can also be provided if some compression and extended ECC coverage also exists.

Figure 5A:
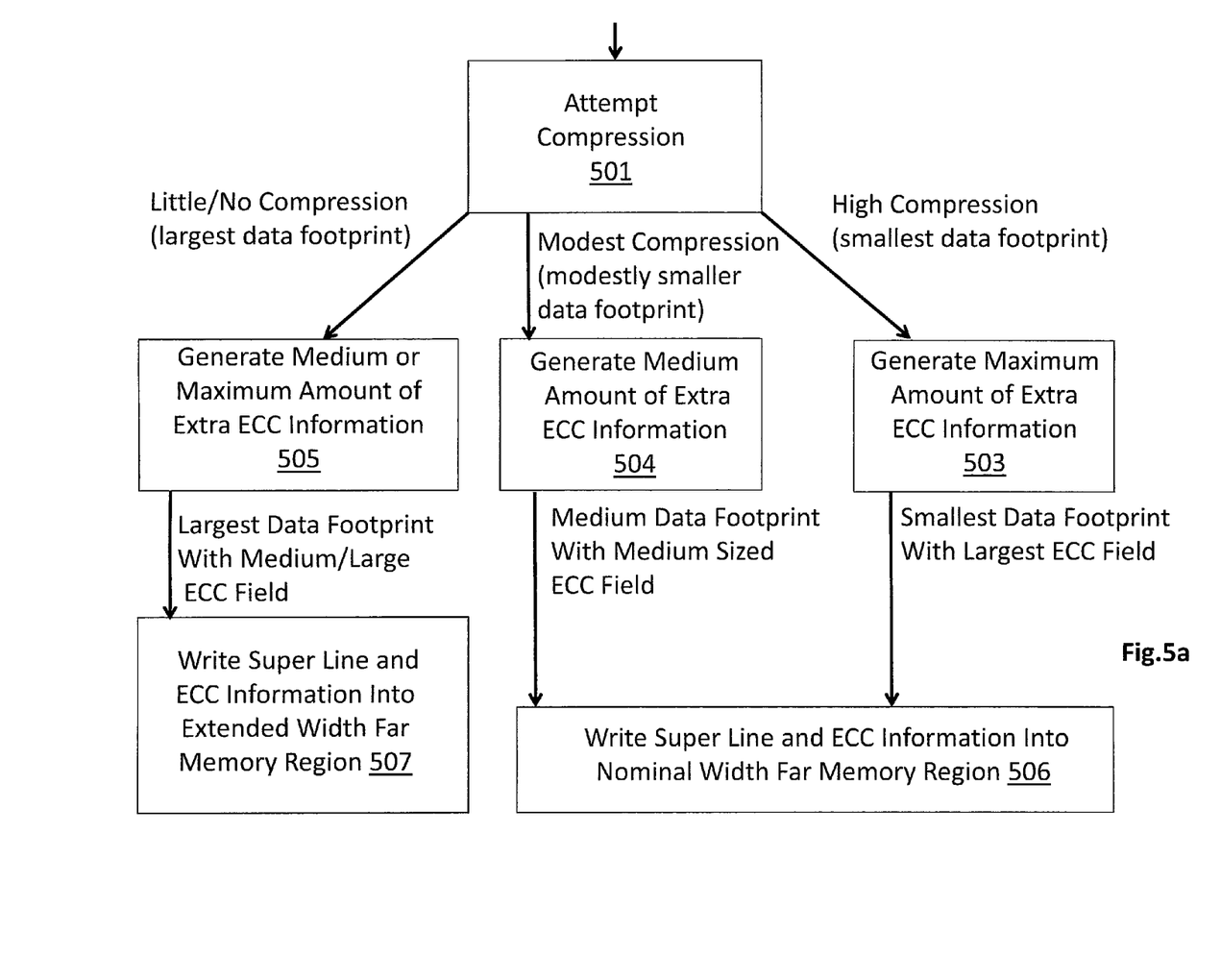
FIGS. 5a and 5b pertain to a third embodiment of the approach of FIGS. 2a and 2b.

FIG. 5a shows another write approach methodology that adopts the principles of FIG. 2a but is different than either of the approaches of FIGS. 3a and 4a. As observed in FIG. 5a, the little/no compression leftmost path employs a more aggressive ECC generation process 505 (as depicted in FIG. 5a, the same ECC generation process as the middle 504 or rightmost 503 paths) resulting in extended ECC coverage even for the larger, uncompressed super lines. The extended ECC coverage for the larger uncompressed super line results, however, in a larger data structure than modestly compressed or more significantly compressed super lines. For instance, in an embodiment where the super lines are nominally 256 bytes and where a super line that is compressed to 240 bytes will generate 24 bytes of ECC information resulting in a total data structure (both super line and ECC information) of 264 bytes, a non compressed cache line may also be given 24 bytes of ECC information resulting in a total data structure (super line and ECC information) of 280 bytes.

Here, the 280 byte wide data structures having non compressed super lines are provided a special region in far memory having a larger (280 byte) data width. By contrast, the modestly compressed super lines (middle path of FIG. 5a) and more aggressively compressed super lines (rightmost path of FIG. 5a) keep a total data structure size of 264 bytes. Recalling that as little as 4% of super lines may fall into the category of little/no compression, far memory 516 only needs to partition approximately 4% of its storage capacity for the larger 280 byte data structure. The remaining 96% can be configured to hold 264 byte data structures.

Figure 5B:
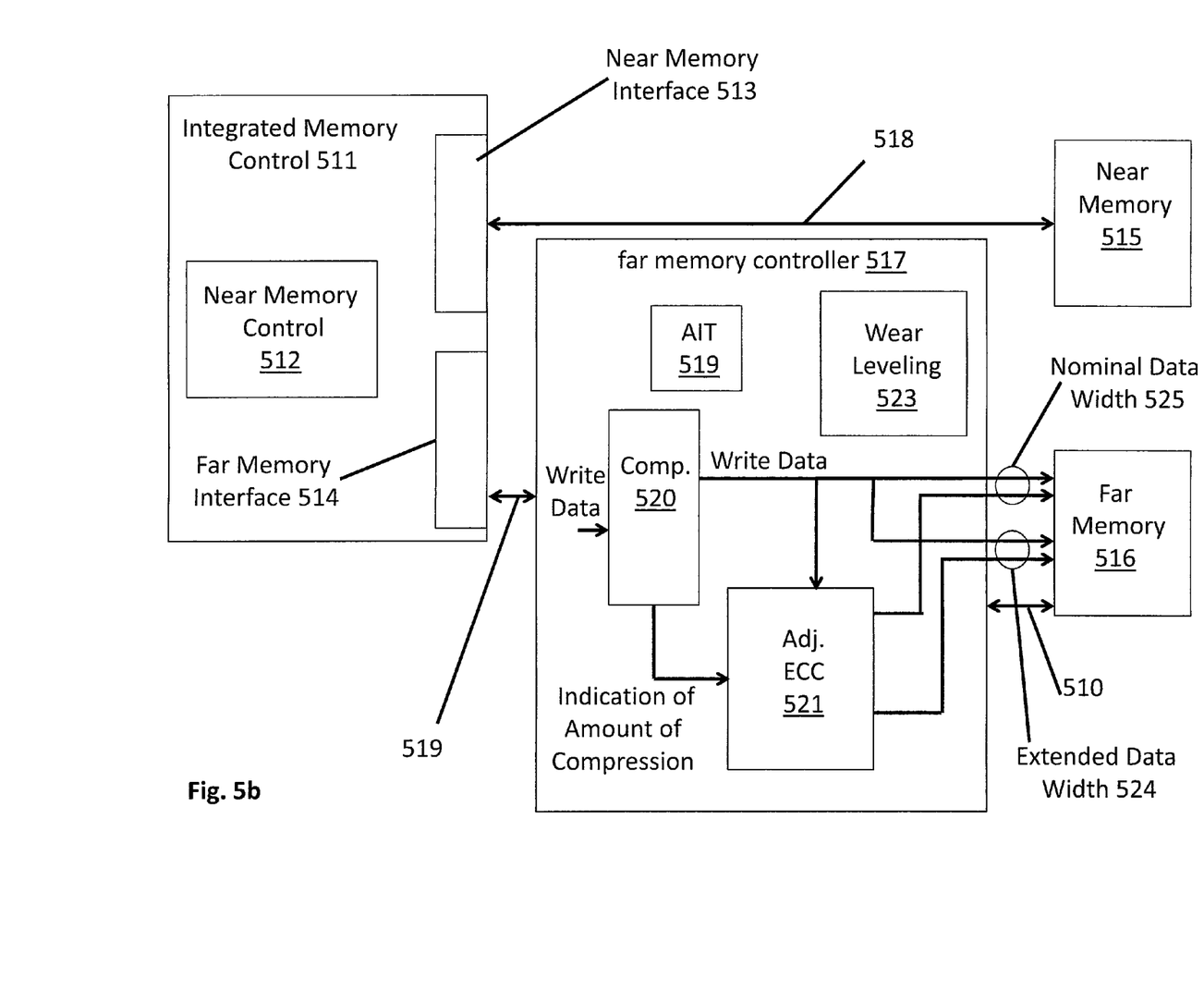

FIG. 5b shows a hardware design for implementing the methodology of FIG. 5a. Here, again, the design is similar to the designs of FIGS. 3b and 4b except that super lines receiving little no compression are directed along a wider write path lane 524 to the physical storage medium. By contrast, super lines receiving modest or more significant compression are directed along a smaller, nominal write path lane 525. Depending on the implementation, paths 524, 525 may be separate physical paths/links, or, may be integrated on a same physical path (e.g., a same data bus). In the case of the latter, as an example, some reserved bits of a same data bus are not used to implement nominal width lane 525, but, to implement extended width lane 524, these reserved bits are used. The lanes 524, 525 may terminate, however, in different far memory devices. For example, the aforementioned bus may terminate on smaller data width far memory devices that are to store data along nominal width path 525 (the reserve data bit lines are not physically coupled to the smaller width memory devices). Likewise, the same aforementioned data bus may terminate on larger data width far memory devices that are to store data along extended data path 524 (the reserve data bit lines are physically coupled to the larger width memory devices).

Although embodiments above have stressed the existence of a multi-level system memory and the use of a super cache line neither are strictly required. For instance, the teachings above could be applied to a single level system memory that uses an emerging memory technology as the storage medium. Additionally, the teachings above could conceivably be applied to a single cache line data structure rather than a super cache line data structure.

Figure 6:
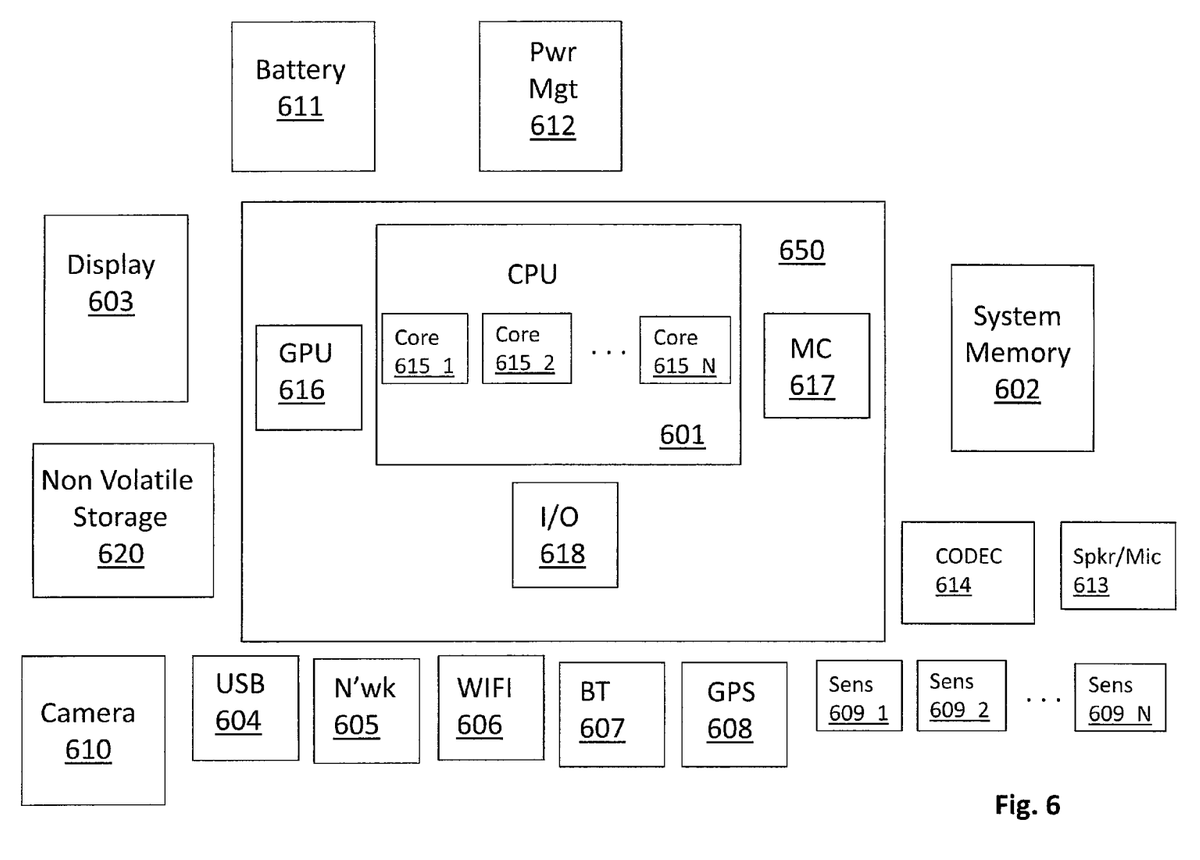
FIG. 6 shows a computing system.

FIG. 6 shows a depiction of an exemplary computing system 600 such as a personal computing system (e.g., desktop or laptop) or a mobile or handheld computing system such as a tablet device or smartphone, or, a larger computing system such as a server computing system. As observed in FIG. 6, the basic computing system may include a central processing unit 601 (which may include, e.g., a plurality of general purpose processing cores and a main memory controller disposed on an applications processor or multi-core processor), system memory 602, a display 603 (e.g., touchscreen, flat-panel), a local wired point-to-point link (e.g., USB) interface 04, various network I/O functions 605 (such as an Ethernet interface and/or cellular modem subsystem), a wireless local area network (e.g., WiFi) interface 606, a wireless point-to-point link (e.g., Bluetooth) interface 607 and a Global Positioning System interface 608, various sensors 609_1 through 609_N (e.g., one or more of a gyroscope, an accelerometer, a magnetometer, a temperature sensor, a pressure sensor, a humidity sensor, etc.), a camera 610, a battery 611, a power management control unit 612, a speaker and microphone 613 and an audio coder/decoder 614.

An applications processor or multi-core processor 650 may include one or more general purpose processing cores 615 within its CPU 601, one or more graphical processing units 616, a memory management function 617 (e.g., a memory controller) and an I/O control function 618. The general purpose processing cores 615 typically execute the operating system and application software of the computing system. The graphics processing units 616 typically execute graphics intensive functions to, e.g., generate graphics information that is presented on the display 603. The memory control function 617 interfaces with the system memory 602. The system memory 602 may be a multi-level system memory such as the multi-level system memory discussed at length above. The system memory may include a memory controller that adjusts ECC coverage as a function of compression applied to a cache line data structure as discussed above.

Each of the touchscreen display 603, the communication interfaces 604-607, the GPS interface 608, the sensors 609, the camera 610, and the speaker/microphone codec 613, 614 all can be viewed as various forms of I/O (input and/or output) relative to the overall computing system including, where appropriate, an integrated peripheral device as well (e.g., the camera 610). Depending on implementation, various ones of these I/O components may be integrated on the applications processor/multi-core processor 650 or may be located off the die or outside the package of the applications processor/multi-core processor 650.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of software or instruction programmed computer components or custom hardware components, such as application specific integrated circuits (ASIC), programmable logic devices (PLD), digital signal processors (DSP), or field programmable gate array (FPGA).

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a semiconductor chip comprising memory controller logic circuitry, said memory controller logic circuitry comprising:
compression circuitry to compress a cache line data structure to be written into a system memory;
adjustable length ECC information generation circuitry to generate an amount of ECC information for the cache line data structure based on an amount of compression applied to the cache line data structure by the compression circuitry;
circuitry to implement a write process sequence for the cache line data structure that is specific for the cache line data structure's amount of compression and/or amount of ECC information and to implement a different write process sequence that is specific for another cache line data structure having a different amount of compression and/or ECC information as the cache line data structure, wherein the different write process sequence provides greater ECC protection to the another cache line data structure than the write process sequence provides to the cache line data structure and wherein the write process sequence comprises one of the following:
a) write the cache line data structure into a low bit error rate region of the system memory;
b) record correct data for a bit of the cache line data structure that is to be written into an unreliable location of the system memory;
c) write the cache line data structure along a wider datapath into a region of the system memory that is reserved for wider width cache line structures, the wider datapath having more data signal lines than a datapath used to transport other cache line data structures that are more compressible than the cache line data structure.

2. The apparatus of claim 1 wherein the cache line data structure comprises a super cache line.

3. The apparatus of claim 1 wherein the memory controller logic circuitry comprises a far memory controller and the cache line is to be written into a non volatile system memory region.

4. The apparatus of claim 3 wherein the non volatile system memory region is composed of any of the following:
a phase change memory;
a ferro-electric random access memory;
a magnetic random access memory;
a spin transfer torque random access memory;
a resistor random access memory;
a memristor memory;
a universal memory;

a Ge2Sb2Te5 memory;
a programmable metallization cell memory;
an amorphous cell memory;
an Ovshinsky memory.

5. The apparatus of claim 1 wherein the write process sequence comprises a) above and a write of the cache line data structure to a region of the system memory having a first bit error rate and the different write process sequence comprise a write of the another cache line data structure to another region of the system memory having a second bit error rate, the second bit error rate being higher than the first bit error rate.

6. The apparatus of claim 1 wherein the write process sequence comprises b) above which further comprises creation of an error correction pointer data structure for the cache line data structure and the different write process sequence comprises no creation of an error correction pointer data structure for the another cache line data structure because the cache line data structure has less compression and/or less ECC information than the another cache line data structure.

7. The apparatus of claim 1 wherein the write process sequence comprises c) above which further comprises creation of a larger combination of data and ECC information and the different write process sequence comprises creation of a smaller combination of data and ECC information because the cache line data structure had less compression than the another cache line data structure.

8. A computing system, comprising:
a plurality of processors;
a multi-level system memory coupled to the plurality of processors;
a memory controller coupled between a system memory level of the multi-level system memory and the plurality of processors, the memory controller comprising:
  i) compression circuitry to compress a cache line data structure to be written into the system memory level;
  ii) adjustable length ECC information generation circuitry to generate an amount of ECC information for the cache line data structure based on an amount of compression applied to the cache line data structure by the compression circuitry;
  iii) circuitry to implement a write process sequence for the cache line data structure that is specific for the cache line data structure's amount of compression and/or amount of ECC information and to implement a different write process sequence that is specific for another cache line data structure having a different amount of compression and/or ECC information as the cache line data structure, wherein the different write process sequence provides greater ECC protection to the another cache line data structure than the write process sequence provides to the cache line data structure and wherein the write process sequence comprises one of the following:
    a) write the cache line data structure into a low bit error rate region of the multi-level system memory;
    b) record correct data for a bit of the cache line data structure that is to be written into an unreliable location of the multi-level system memory;
    c) write the cache line data structure along a wider datapath into a region of the multi-level system memory that is reserved for wider width cache line structures, the wider datapath having more data signal lines than a datapath used to transport other cache line data structures that are more compressible than the cache line data structure.

9. The computing system of claim 8 wherein the cache line data structure comprises a super cache line.

10. The computing system of claim 8 wherein the memory controller comprises a far memory controller and the cache line is to be written into a non volatile system memory region.

11. The computing system of claim 10 wherein the non volatile system memory region is composed of any of the following:
a phase change memory;
a ferro-electric random access memory;
a magnetic random access memory;
a spin transfer torque random access memory;
a resistor random access memory;
a memristor memory;
a universal memory;
a Ge2Sb2Te5 memory;
a programmable metallization cell memory;
an amorphous cell memory;
an Ovshinsky memory.

12. The computing system of claim 8 wherein the write process sequence comprises a) above and a write of the cache line data structure to a region of the multi-level system memory having a first bit error rate and the different write process sequence comprise a write of the another cache line data structure to another region of the multi-level system memory having a second bit error rate, the second bit error rate being higher than the first bit error rate, the other cache line data structure comprising more ECC protection than the cache line data structure.

13. The computing system of claim 8 wherein the write process sequence comprises b) above which further comprises creation of an error correction pointer data structure for the cache line data structure and the different write process sequence comprises no creation of an error correction pointer data structure for the another cache line data structure because the cache line data structure has less compression and/or less ECC information than the another cache line data structure.

14. The computing system of claim 8 wherein the write process sequence comprises c) above which further comprises creation of a larger combination of data and ECC information and the different write process sequence comprises creation of a smaller combination of data and ECC information because the cache line data structure had less compression than the another cache line data structure.

15. The computing system of claim 8, further comprising one or more of:
a network interface communicatively coupled to the plurality of processors, a battery communicatively coupled to the plurality of processors, and
a display communicatively coupled to the plurality of processors.

16. A method, comprising:
compressing a first cache line data structure;
calculating a first amount of ECC information for the first cache line data structure based on the amount of compression applied to the first cache line data structure;
writing the first cache line data structure into a system memory according to a first write process sequence that is based at least in part on the amount of compression and/or ECC information of the first cache line data structure, the first write sequence process comprising one of a), b), c) below:
  a) writing the first cache line data structure into a low bit error rate region of the system memory;

b) recording correct data for a bit of the first cache line data structure that is to be written into an unreliable location of the system memory;

c) writing the first cache line data structure along a wider datapath into a region of the system memory that is reserved for wider width cache line structures;

compressing a second cache line data structure, the wider datapath having more data signal lines than a datapath used to transport other cache line data structures that are more compressible than the first cache line data structure;

calculating a second amount of ECC information for the second cache line data structure based on the amount of compression applied to the second cache line data structure, the second amount of ECC information providing more ECC protection to the second cache line data structure than the first amount of ECC information provides to the first cache line data structure; and, writing the second cache line data structure into the system memory according to a second write process sequence that is based at least in part of the amount of compression and/or ECC information of the second cache line data structure, the first write process sequence being different than the second write process sequence as a consequence of the amount of compression and/or ECC information of the first cache line data structure being different than the amount of compression and/or ECC information of the second cache line data structure.

17. The method of claim 16 wherein the first write process sequence comprises a) above which further comprises a write of the first cache line data structure to a region of the system memory having a first bit error rate and the second write process sequence comprise a write of the second cache line data structure to another region of the system memory having a second bit error rate, where, the first bit error rate is higher than the second bit error rate and the first cache line data structure has more ECC information than the second cache line data structure.

18. The method of claim 16 wherein the first write process sequence comprises b) above which further comprises creation of an error correction pointer data structure for the first cache line data structure and the second write process sequence comprises no creation of an error correction pointer data structure for the second cache line data structure because the first cache line data structure has less compression and/or less ECC information than the second cache line data structure.

19. The method of claim 16 wherein the first write process sequence comprises c) above which further comprises creation of a larger combination of data and ECC information and the second write process sequence comprises creation of a smaller combination of data and ECC information because the first cache line data structure had less compression than the second cache line data structure.

* * * * *